(12) United States Patent
Yamamoto et al.

(10) Patent No.: US 10,701,849 B2
(45) Date of Patent: Jun. 30, 2020

(54) COMPONENT PLACEMENT MACHINE AND COMPONENT PLACEMENT METHOD

(71) Applicant: Panasonic Intellectual Property Management Co., Ltd., Osaka (JP)

(72) Inventors: Shinji Yamamoto, Yamanashi (JP);
Koji Sakurai, Yamanashi (JP);
Hiroyuki Fujiwara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 241 days.

(21) Appl. No.: 15/595,981

(22) Filed: May 16, 2017

(65) Prior Publication Data

US 2017/0354068 A1   Dec. 7, 2017

(30) Foreign Application Priority Data

Jun. 6, 2016   (JP) ................. 2016-112331

(51) Int. Cl.
| | |
|---|---|
| *H05K 3/34* | (2006.01) |
| *H05K 13/00* | (2006.01) |
| *H05K 13/04* | (2006.01) |

(52) U.S. Cl.
CPC ..... *H05K 13/0015* (2013.01); *H05K 13/0061* (2013.01); *H05K 13/0069* (2013.01); *H05K 13/04* (2013.01); *Y10T 29/53174* (2015.01)

(58) Field of Classification Search
CPC ........... H05K 13/0015; H05K 13/0061; H05K 13/0069; H05K 13/04; H05K 13/0812; Y10T 29/49131; Y10T 29/53061; Y10T 29/5391; Y10T 29/53174

USPC ............. 29/832, 833, 714, 721, 739
See application file for complete search history.

(56) References Cited

U.S. PATENT DOCUMENTS

| | | | | | |
|---|---|---|---|---|---|
| 5,086,556 | A | * | 2/1992 | Toi ..................... | H05K 13/0812 29/740 |
| 6,427,313 | B2 | * | 8/2002 | Ishitani ............. | H05K 13/0069 269/13 |
| 6,637,275 | B2 | * | 10/2003 | Wu ..................... | A47C 23/002 73/862.046 |
| 6,775,904 | B1 | * | 8/2004 | Duebel ............. | H05K 13/0069 29/743 |
| 6,788,806 | B2 | * | 9/2004 | Kadomatsu ........ | H05K 13/0812 382/147 |
| 9,198,336 | B2 | * | 11/2015 | Kihara ............... | H05K 13/0069 |

FOREIGN PATENT DOCUMENTS

| | | |
|---|---|---|
| JP | H06-104597 A | 4/1994 |
| JP | 2000-299597 A | 10/2000 |

* cited by examiner

*Primary Examiner* — Donghai D Nguyen
(74) *Attorney, Agent, or Firm* — Pearne & Gordon LLP

(57) ABSTRACT

A lower surface of a board arranged at a working position is supported by a board supporter, and heights of a plurality of portions of the lower surface of the board are measured by a plurality of height measuring instruments attached to the board supporter. A component is installed on the board by control of a height of the installation of the component by an installation head and with respect to the board, which has the lower surface supported by the board supporter, being performed based on the height of the plurality of portions of the lower surface of the board measured by the plurality of height measuring instruments.

9 Claims, 9 Drawing Sheets

FIG. 6A
FIG. 6B
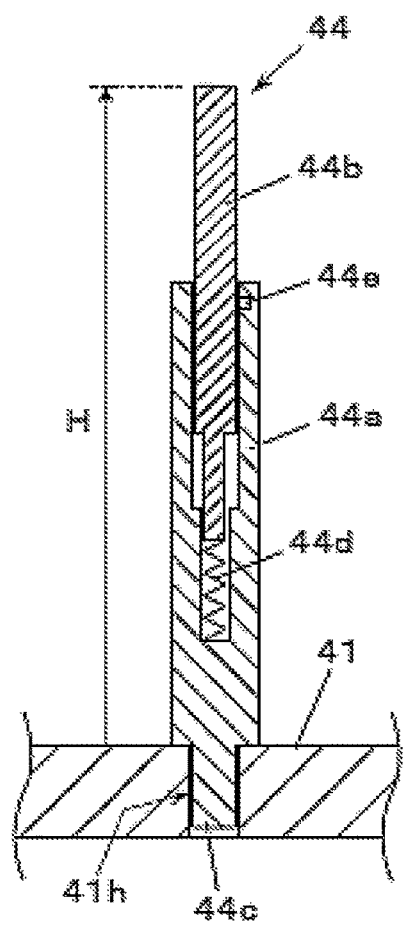
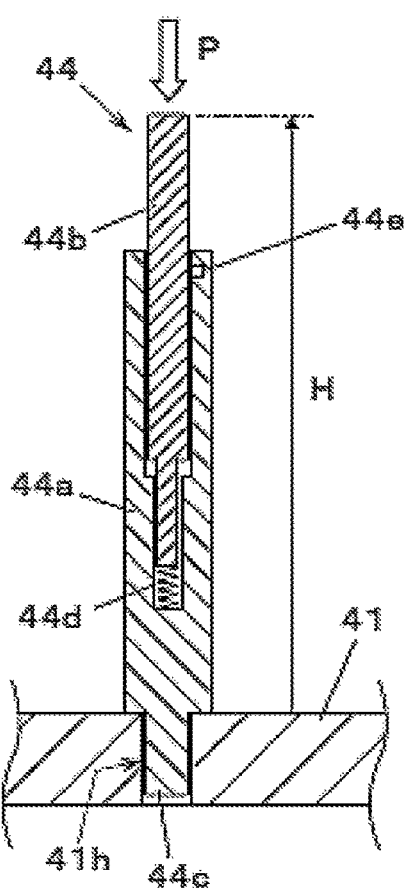

COMPONENT PLACEMENT MACHINE AND COMPONENT PLACEMENT METHOD

BACKGROUND

1. Technical Field

The present disclosure relates to a component placement machine and a component placement method for installing a component on a board.

2. Description of the Related Art

A component placement machine installs a component by an installation head and with respect to a board arranged at a working position.

A lower surface of the board arranged at the working position is supported by a board supporter, and the component is installed in a state where the lower surface has a stable posture. In this type of component placement machine, a height at a time of the installation of the component on the board (installation height) varies with a height of the component, and the installation height also depends on a shape of warpage of the board (heights of respective positions on the board) in a case where the board has the warpage. Therefore, heights of respective positions of an upper surface of a board that has a lower surface supported by a board supporter are measured by a laser displacement meter installed above the board being used and the installation height is corrected based on the warpage of the board obtained as a result in the related art (refer to, for example, PTL 1 below).

CITATION LIST

Patent Literature

PTL 1: Japanese Patent Unexamined Publication No. 2000-299597

SUMMARY

The board height measurement in the component placement machine according to the related art described above is performed by the laser displacement meter performing scanning for a certain period of time after the lower surface of the board is supported by the board supporter, and thus poses a problem in the form of takt time being negatively affected by an increase in the length of time until board installation initiation.

An object of the present disclosure is to provide a component placement machine and a component placement method for achieving takt time improvement by reducing the length of time required for board height measurement.

A component placement machine according to the present disclosure is a component placement machine installing a component by an installation head and with respect to a board arranged at a working position and including a board supporter supporting a lower surface of the board arranged at the working position, a plurality of height measuring instruments attached to the board supporter and measuring heights of a plurality of portions of the lower surface of the board, and a controller performing control of a height of the installation of the component by the installation head and with respect to the board based on the heights of the plurality of portions and installing the component on the board.

A component placement method according to the present disclosure is a component placement method for installing a component by an installation head and with respect to a board arranged at a working position, the component placement method including a board supporting process of supporting a lower surface of the board arranged at the working position with a board supporter, a height measurement process of measuring heights of a plurality of portions of the lower surface of the board with a plurality of height measuring instruments attached to the board supporter, and a component installation process of installing the component on the board by performing control of a height of the installation of the component by the installation head and with respect to the board based on the heights of the plurality of portions.

According to the present disclosure, takt time improvement can be achieved by the length of time required for board height measurement being reduced.

BRIEF DESCRIPTION OF THE DRAWINGS

FIG. 2 is a perspective view of a board transport mechanism and a board supporter that the component placement machine according to the exemplary embodiment of the present disclosure is provided with;

FIG. 3 is a partial exploded perspective view of the board transport mechanism that the component placement machine according to the exemplary embodiment of the present disclosure is provided with;

FIG. 4A is a partial side view of the board transport mechanism that the component placement machine according to the exemplary embodiment of the present disclosure is provided with;

FIG. 4B is a partial side view of the board transport mechanism that the component placement machine according to the exemplary embodiment of the present disclosure is provided with;

FIG. 5 is a partial exploded perspective view of the board supporter that the component placement machine according to the exemplary embodiment of the present disclosure is provided with;

FIG. 6A is a sectional view of a height measuring instrument of the board supporter that the component placement machine according to the exemplary embodiment of the present disclosure is provided with;

FIG. 6B is a sectional view of the height measuring instrument of the board supporter that the component placement machine according to the exemplary embodiment of the present disclosure is provided with;

FIG. 7 is a plan view illustrating an example of arrangement of a support pin and the height measuring instrument attached to a rising and falling body that the component placement machine according to the exemplary embodiment of the present disclosure is provided with;

FIG. 10A is a side view illustrating a state where a board is supported by the board supporter that the component placement machine according to the exemplary embodiment of the present disclosure is provided with; and FIG. 10B is a side view illustrating the state where the board is supported by the board supporter that the component placement machine according to the exemplary embodiment of the present disclosure is provided with.

DETAILED DESCRIPTION

Figure 1:
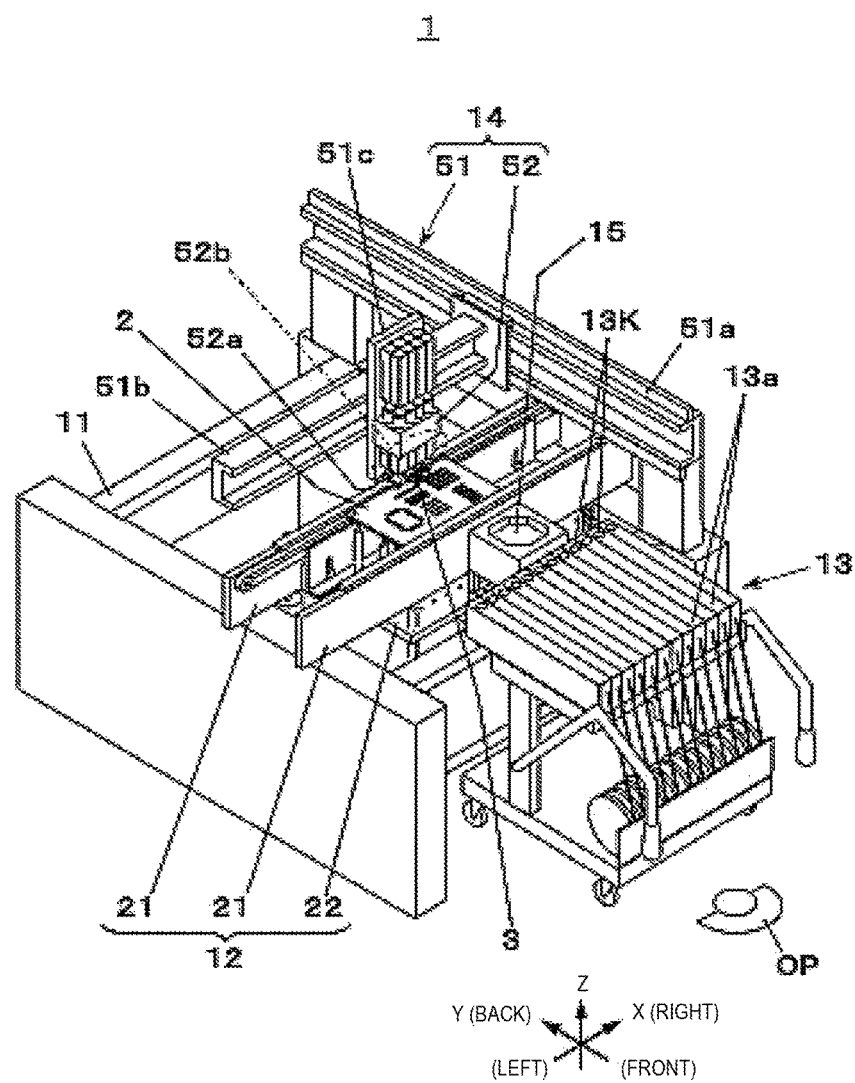
FIG. 1 is a perspective view of a component placement machine according to an exemplary embodiment of the present disclosure.

Hereinafter, an exemplary embodiment of the present disclosure will be described with reference to accompanying drawings. Component placement machine 1 illustrated in FIG. 1 is a machine installing components 3 on board 2 and is provided with board transport mechanism 12, component supplier 13, component installation mechanism 14, and component capture 15 on base 11. For convenience of description, a left-right direction and a front-back direction of component placement machine 1 seen from worker OP will be regarded as an X-axis direction and a Y-axis direction, respectively. An up-down direction will be regarded as a Z-axis direction.

Figure 2:
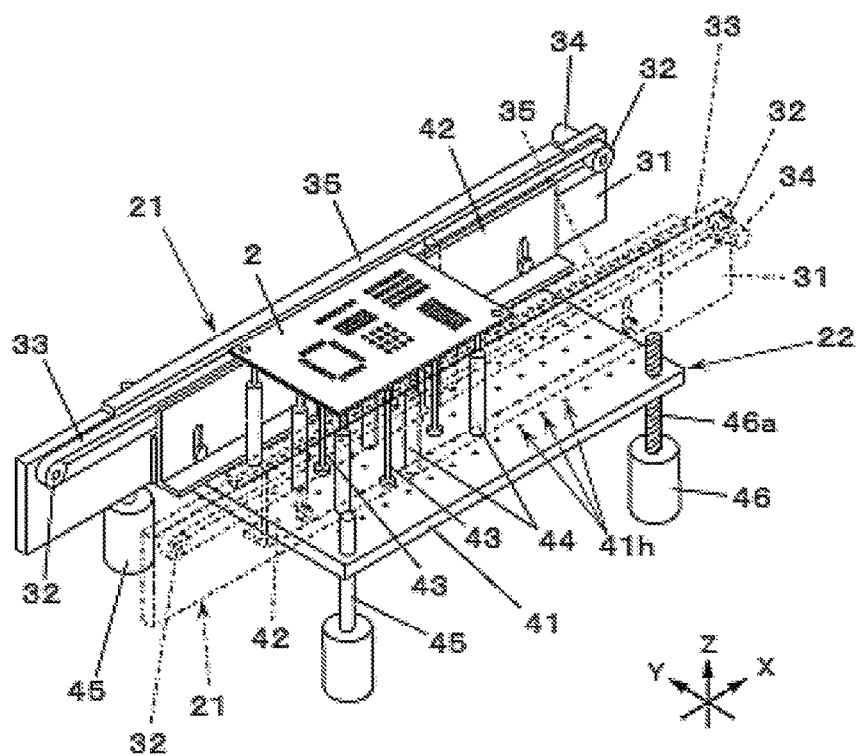

According to FIGS. 1 and 2, board transport mechanism 12 has front and back conveyor units 21, which form one pair, and board supporter 22. The pair of front and back conveyor units 21 transports board 2 in the X-axis direction (from left to right) and arranges board 2 at a working position near a middle section of base 11. Board supporter 22 rises and falls between the pair of conveyor units 21 and supports a lower surface of board 2 arranged at the working position.

According to FIG. 2, each of conveyor units 21 is provided with base member 31 extending in the X-axis direction, a pair of pulleys 32 disposed in both end portions of base member 31 in the X-axis direction, and transport belt 33 laid across the pair of pulleys 32. Belt driving motor 34 is disposed in base member 31 of each conveyor unit 21. Belt driving motor 34 allows transport belt 33 to proceed by driving one of pulleys 32 (that in the back herein). The pair of transport belts 33 is run in synchronization with each other and transports board 2 with both front and back end portions of board 2 supplied from the outside supported from below. Overhang 35 overhanging inward (to a side where two base members 31 arranged in the front and back face each other) is disposed to extend in the front-back direction in an upper end portion of base member 31 of each conveyor unit 21.

Board supporter 22 in FIG. 2 is provided with rising and falling body 41 spreading out on an XY plane and a pair of plate members 42 and a plurality of support pins 43 arranged in the front and back on rising and falling body 41. A plurality of pin-type height measuring instruments 44 is attached to an upper surface of rising and falling body 41 as well.

Figure 3:
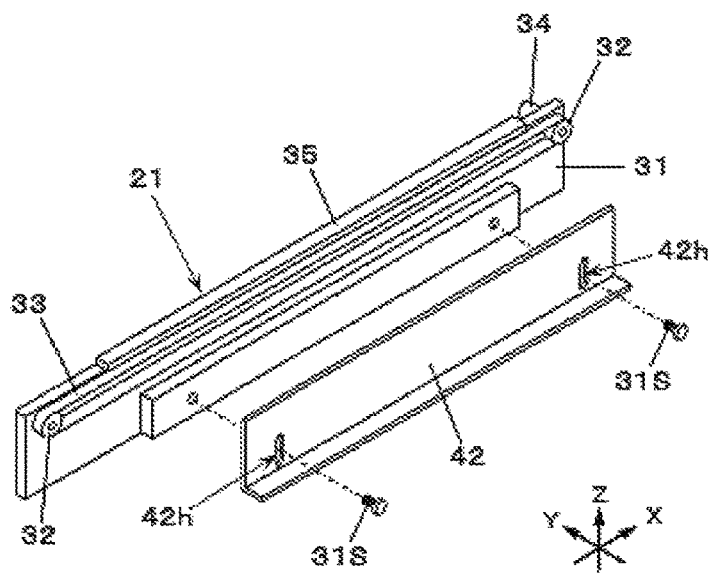

According to FIG. 2, rising and falling body 41 is disposed at a position below board 2 arranged at the working position. Referring also to FIG. 3, the pair of plate members 42 is attached to surfaces of the pair of conveyor units 21 inside base members 31 (surfaces on the side where two base members 31 face each other) to be capable of rising and falling with respect to base members 31 (to be capable of rising and falling with respect to transport belts 33 as a result). The pair of plate members 42 is positioned in a region between the pair of transport belts 33.

According to FIG. 2, rising and falling body 41 is supported to be capable of moving in the Z-axis direction by a plurality of rising and falling guides 45 extending in the Z-axis direction. Ball screw 46a, which is driven to rotate by rising and falling motor 46 and extends in the Z-axis direction, extends through rising and falling body 41. Once ball screw 46a is driven by rising and falling motor 46, rising and falling body 41 is guided by rising and falling guides 45 and rises and falls in a region between the pair of conveyor units 21.

According to FIG. 3, plate member 42 of each conveyor unit 21 has long holes 42h, which extend in the up-down direction, in both end portions in the X-axis direction. Two screw members 31S, which are attached to an inner surface side of base member 31, pass through these two long holes 42h. Therefore, each plate member 42 is capable of moving in the Z-axis direction with respect to base member 31 by two long holes 42h functioning as guides.

Rising and falling body 41 rises and falls between a non-clamp position (FIG. 4A) below the working position of board 2 and a clamp position (FIG. 4B) above the non-clamp position as a result of the driving of ball screw 46a by rising and falling motor 46. In a state where rising and falling body 41 is arranged at the non-clamp position (FIG. 4A), the upper surface of rising and falling body 41 is not in contact with a lower end of plate member 42 and plate member 42 hangs down because of its own weight, causing an upper edge of long hole 42h to abut against screw member 31S. At this non-clamp position, an upper end of plate member 42 is positioned below board transport surface PL of transport belt 33.

Figure 4A:
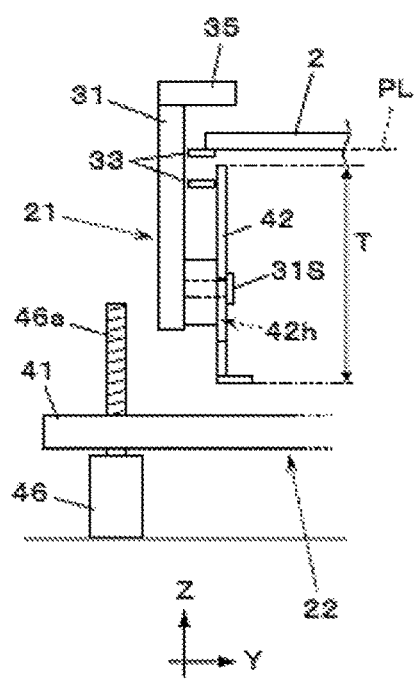
Figure 4B:
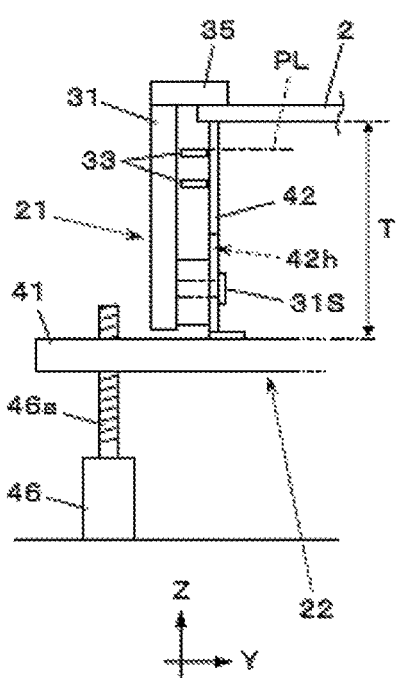

Once rising and falling body 41 rises from the non-clamp position, rising and falling body 41 abuts against the lower end of plate member 42 from below and pushes up plate member 42 (FIG. 4A→FIG. 4B). In a state where the upper surface of rising and falling body 41 is in contact with the lower end of plate member 42, plate member 42 rises in tandem with rising and falling body 41 and pushes up both ends of board 2 with the ends supported by the pair of transport belts 33. In a state where rising and falling body 41 is arranged at the clamp position (FIG. 4B), the upper end of plate member 42 is positioned above board transport surface PL of transport belt 33 and both ends of board 2 are pressed against lower surfaces of the pair of overhangs 35 from below. As a result, a state occurs where both ends of board 2 are pinched and clamped between the pair of plate members 42 and the pair of overhangs 35 (FIG. 4B).

Figure 5:
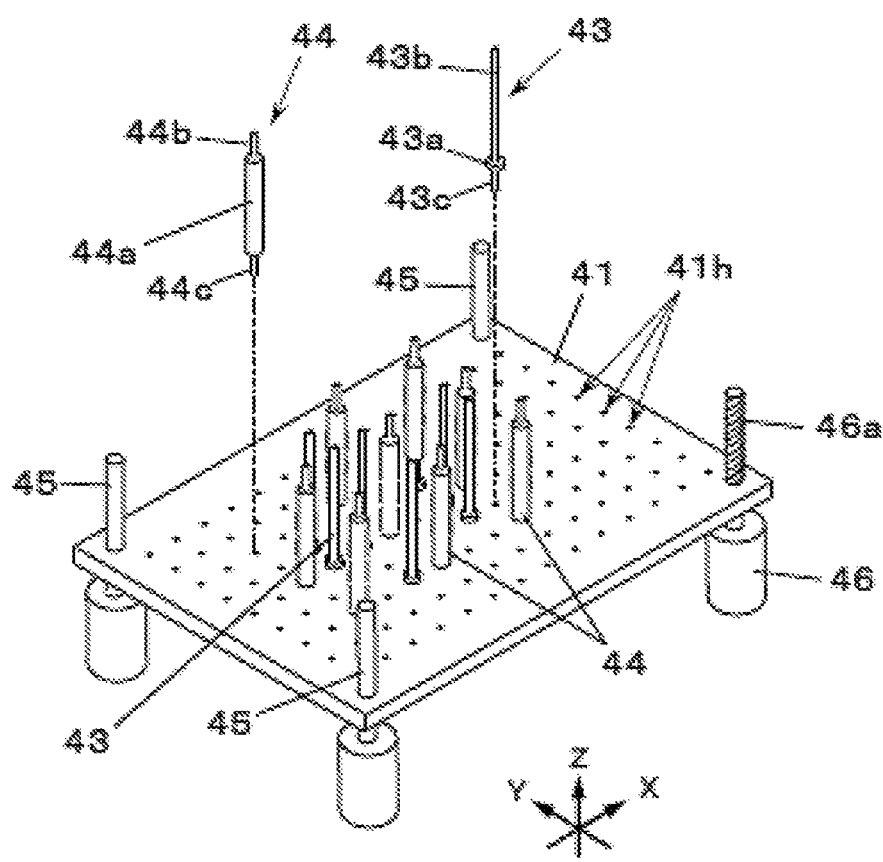

According to FIG. 5, a plurality of pin attachment sections 41h arranged in a matrix shape is disposed in the upper surface of rising and falling body 41. Holes disposed to be open to the upper surface of rising and falling body 41 form respective pin attachment sections 41h.

According to FIG. 5, support pin 43 has flange 43a larger in outer shape than pin attachment section 41h, supporter 43b extending upward from flange 43a, and projection 43c protruding downward and extending from flange 43a. When support pin 43 is attached to rising and falling body 41, projection 43c of support pin 43 is inserted into pin attachment section 41h from above. Each support pin 43 is selectively attached to one of the plurality of pin attachment sections 41h. In other words, projection 43c has a shape that allows its attachment to at least one of the plurality of pin attachment sections 41h.

The plurality of support pins 43 attached to rising and falling body 41 supports the lower surface of board 2 pushed up by the pair of plate members 42. Therefore, support pins 43 are attached to positions (pin attachment sections 41h) not interfering with components 3 in a case where components 3 installed on the lower surface of board 2 are present.

Support pin 43 attached to rising and falling body 41 has a height (dimension in the Z-axis direction from the upper surface of rising and falling body 41 to an upper end of supporter 43b) that is substantially equal to a dimension in the Z-axis direction between the lower and upper ends of plate member 42 (hereinafter, referred to as "plate height T", FIGS. 4A and 4B). Therefore, in a case where board 2 has warpage of downward curvature, the warped part of board 2 is pushed up by support pin 43 and corrected to be given a flat plate shape.

According to FIG. 1, a plurality of tape feeders 13a constitutes component supplier 13. The plurality of tape feeders 13a is arranged in parallel in the X-axis direction in an end portion of base 11 on the front side (near side seen from worker OP). Tape feeders 13a successively supply components 3 to respective component supply ports 13K positioned in its end portion on the back side (far side seen from worker OP).

Head moving mechanism 51 disposed on base 11 and installation head 52 moved by head moving mechanism 51 constitute component installation mechanism 14 in FIG. 1. Head moving mechanism 51 is provided with fixed table 51a, moving table 51b, and moving plate 51c. Both end portions of fixed table 51a are fixed to base 11 with one end portion of base 11 in the X-axis direction (right end portion herein) extending in the Y-axis direction. Moving table 51b extends in the X-axis direction and its one end portion (right end portion) is capable of moving along fixed table 51a. Moving plate 51c is disposed to be capable of moving along moving table 51b. Installation head 52 is attached to moving plate 51c.

According to FIG. 1, installation head 52 is provided with a plurality of suction nozzles 52a. Each of suction nozzles 52a extends downward with its lower end being a component suction port. Installation head 52 is provided with suction controller 52b, and suction controller 52b is connected to a vacuum source (not illustrated). Suction controller 52b generates a vacuum suction force at the component suction port of each suction nozzle 52a by controlling a vacuum pressure supplied by the vacuum source.

Head moving mechanism 51 allows installation head 52 to be moved in directions within a horizontal plane (within the XY plane) by a movement of moving table 51b in the Y-axis direction with respect to fixed table 51a and a movement of moving plate 51c in the X-axis direction with respect to moving table 51b. Component installation mechanism 14 is operated for component 3 to be installed on board 2 with its lower surface supported by board supporter 22.

Component capture 15 in FIG. 1 is disposed in a region between board transport mechanism 12 and component supplier 13 on base 11. A camera that has an upward imaging field of view constitutes component capture 15. Component capture 15 images an object that passes above itself (specifically, component 3 picked up by installation head 52) from below.

According to FIGS. 5, 6A, and 6B, each of height measuring instruments 44 has cylindrical base section 44a larger in outer shape than pin attachment section 41h disposed in rising and falling body 41, contact portion 44b extending upward from an upper end of base section 44a, and insertion section 44c extending and protruding downward from a lower end of base section 44a. Height measuring instrument 44 is selectively attached to a place among the plurality of pin attachment sections 41h disposed in rising and falling body 41 where no support pin 43 is attached by insertion section 44c being inserted from above into pin attachment section 41h (FIG. 5). In other words, insertion section 44c has a shape that allows its attachment to at least one of the plurality of pin attachment sections 41h. The plurality of height measuring instruments 44 attached to rising and falling body 41 measures heights of a plurality of portions of the lower surface of board 2 supported by board supporter 22.

According to FIGS. 6A and 6B, contact portion 44b is biased upward by biasing spring 44d compressed in base section 44a. Sensor section 44e is disposed in base section 44a. Sensor section 44e detects a height of an upper end of contact portion 44b (height from the upper surface of rising and falling body 41) as "measurement height H" based on a relative position of contact portion 44b with respect to base section 44a in the Z-axis direction.

Referring to FIG. 6A, height measuring instrument 44 has maximum measurement height H in a state where nothing is in contact with the upper end of contact portion 44b and no downward pressing force acts on contact portion 44b (fully elongated state of height measuring instrument 44). When a pressing force acts on the upper end of contact portion 44b and contact portion 44b is pushed down with respect to base section 44a (arrow P illustrated in FIG. 6B), measurement height H of height measuring instrument 44 falls short of that in the fully elongated state (FIG. 6B).

A value exceeding plate height T is set as measurement height H of each height measuring instrument 44 in the fully elongated state. Therefore, the respective upper ends of the plurality of height measuring instruments 44 attached to rising and falling body 41 (upper ends of contact portions 44b) abut against the lower surface of board 2 in the state where both ends of board 2 are pinched and clamped between the pair of plate members 42 and the pair of overhangs 35. Therefore, the height of the position of the lower surface of board 2 against which the upper end abuts (height measurement portion) is measured.

Figure 7:
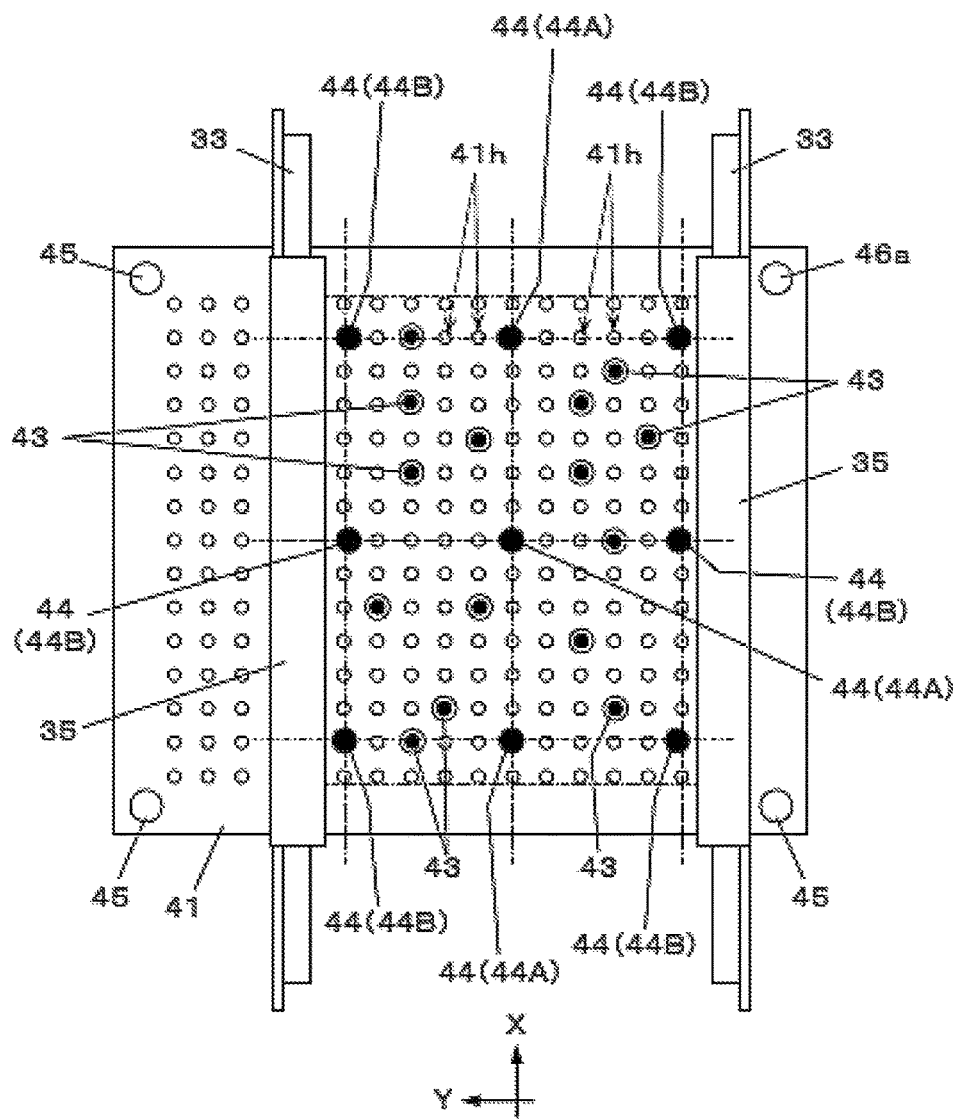

Each of height measuring instruments 44 is selectively attached to the plurality of pin attachment sections 41h disposed in rising and falling body 41 as described above, and the selection of the portion it is attached to is performed based on which of the portions of the lower surface of board 2 is to be subjected to height measurement. At this time, one or more of the plurality of height measuring instruments 44 (that have sign 44A in FIG. 7, three in FIG. 7) are attached to positions where the height of the lower surface can be measured at substantially middle positions of the lower surface of board 2 in a width direction (Y-axis direction). One or more of the plurality of height measuring instruments 44 (that have sign 44B in FIG. 7, six in FIG. 7) are attached to positions where the heights of end-portion positions of the lower surface of board 2 in the width direction can be measured.

The measurement of the height of the lower surface at the substantially middle position of board 2 in the width direction and by height measuring instrument 44 described above is because it is suitable for obtaining a maximum value of an upward displacement amount of board 2. This is because the upward displacement amount of substantially the middle of board 2 in the width direction is highly likely to be the maximum value of the upward displacement amount of board 2 in a case where board 2 has warpage of upward curvature (in this case, board 2 as a whole is curved in the shape of a cylinder that has the X-axis direction as its central axis). The measurement of the height of the lower surface at the end-portion position of board 2 in the width direction and by height measuring instrument 44 is because it is suitable for obtaining a reference value of the upward displacement amount of board 2. This is because the upward displacement amount in both end portions of board 2 is highly likely to be substantially zero even in a case where board 2 has warpage of upward curvature.

Figure 8:
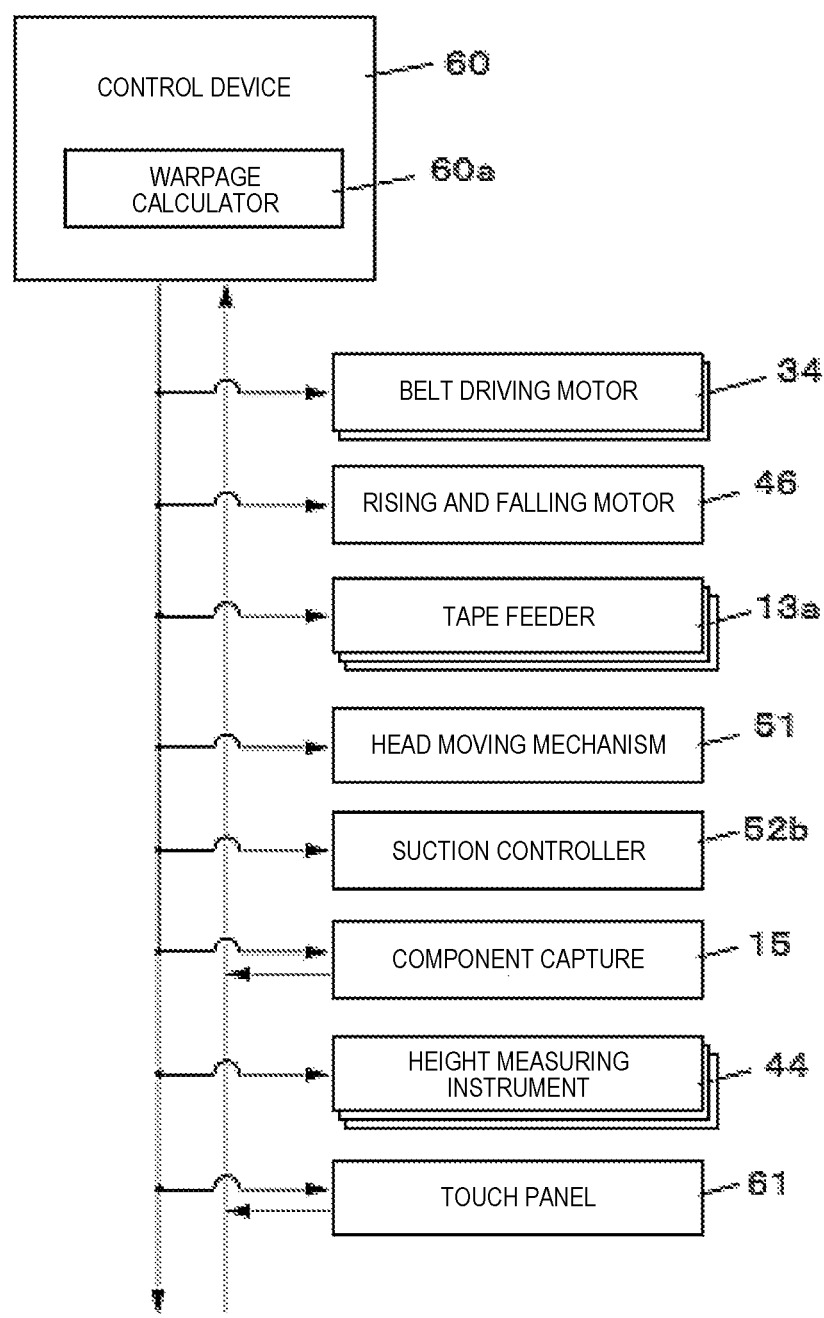
FIG. 8 is a block diagram illustrating a control system of the component placement machine according to the exemplary embodiment of the present disclosure.

Referring to FIG. 8, control device 60 that component placement machine 1 is provided with performs control regarding the imaging operation by component capture 15 and operation control regarding each tape feeders 13*a*, head moving mechanism 51, suction controller 52*b*, respective belt driving motors 34 that the pair of conveyor unit 21 is provided with, and rising and falling motor 46 that board supporter 22 is provided with. Image data obtained as a result of the imaging by component capture 15 is sent to control device 60 and goes through image recognition in control device 60.

Information on the height of each height measurement portion measured by height measuring instrument 44 is input to control device 60 in FIG. 8. Warpage calculator 60*a* is disposed in control device 60 (refer to FIG. 8). Warpage calculator 60*a* calculates the warpage of board 2 based on the measured heights of the plurality of height measurement portions of the lower surface of board 2. In the present exemplary embodiment, warpage calculator 60*a* calculates the warpage of board 2 by estimating a change in the height of the lower surface of board 2 in the width direction based on measurement heights H of the three height measurement portions near the middle section of board 2 in the width direction and measurement heights H of the six height measurement portions near the end portions of board 2 in the width direction.

According to FIG. 8, touch panel 61 as an input and output device is connected to control device 60. Touch panel 61 not only functions as an input device with which worker OP performs required input on control device 60 but also functions as an output device with which control device 60 displays states of component placement machine 1 to worker OP or gives worker OP a working instruction.

Figure 9A:
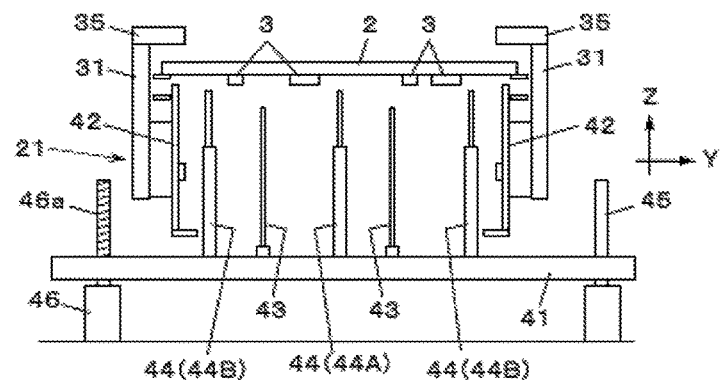
FIG. 9A is a diagram showing an operation of the component placement machine according to the exemplary embodiment of the present disclosure.

A component placement work for component 3 to be installed on board 2 by component placement machine 1 is initiated by worker OP performing a work initiation operation from touch panel 61. Once the work initiation operation from touch panel 61 is performed by worker OP, the pair of conveyor units 21 is operated first, by being controlled by control device 60, and then board 2 supplied from the outside is received and transported to the working position (transport process). After board 2 is arranged at the working position, rising and falling motor 46 is operated and rising and falling body 41 is raised from the non-clamp position (FIG. 9A→FIG. 9B).

Figure 9B:
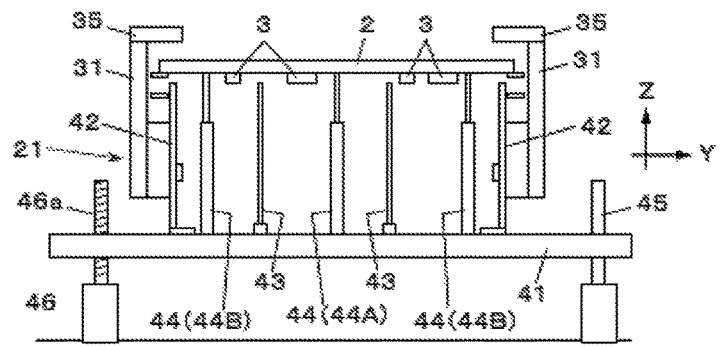
FIG. 9B is a diagram showing the operation of the component placement machine according to the exemplary embodiment of the present disclosure.

As a result of the rise of rising and falling body 41, the upper end of each height measuring instrument 44 attached to rising and falling body 41 abuts against the lower surface of board 2 first (FIG. 9B). Once rising and falling body 41 further rises subsequently, contact portion 44*b* of each height measuring instrument 44 is put into base section 44*a* and the upper ends of the pair of plate members 42 pushed up by rising and falling body 41 and the upper end of each support pin 43 attached to rising and falling body 41 abut against the lower surface of board 2.

Figure 9C:
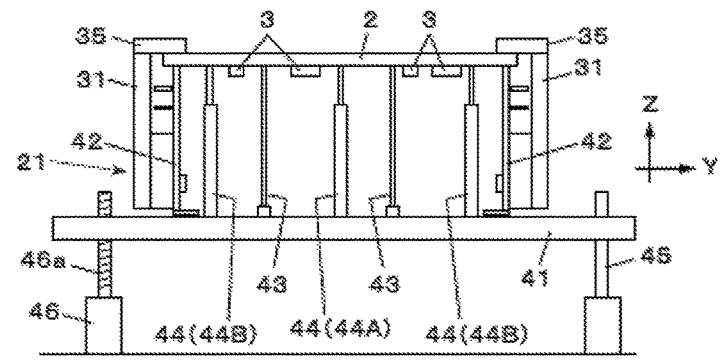
FIG. 9C is a diagram showing the operation of the component placement machine according to the exemplary embodiment of the present disclosure.

Once rising and falling body 41 further rises, both ends of board 2 are pushed up by the pair of plate members 42. As a result, both ends of board 2 are separated upward from the pair of transport belts 33, pressed against the pair of overhangs 35 from below by the pair of plate members 42, and clamped as a result of the pressing, and a state occurs where the lower surface of board 2 is supported by board supporter 22 (board supporting process, FIG. 9C).

Figure 10A:
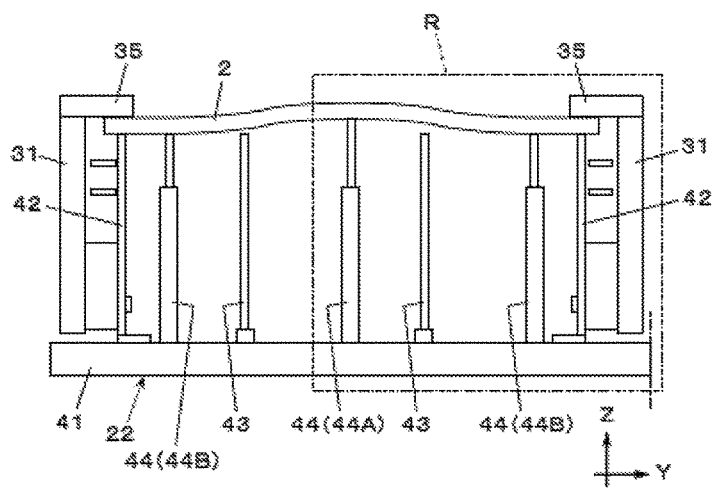

Board 2 has a flat plate shape in the state where the lower surface is supported by board supporter 22 in a case where board 2 has no warpage from the outset. Even in a case where board 2 has warpage of downward curvature, the warpage is pushed up by support pin 43 and corrected, and thus board 2 has a flat plate shape. In a case where board 2 has warpage of upward curvature, in contrast, the warpage is maintained even in the state where the lower surface is supported by board supporter 22. In other words, board 2 has a shape in which its middle section in the width direction (Y-axis direction) protrudes upward from its end portion in the width direction (FIG. 10A). In the case of the upward curvature of board 2, a state occurs in some cases where the upper end of support pin 43 is separated from the lower surface of board 2 in a region near the middle section of board 2 in the width direction. Even in this case, the upper end of height measuring instrument 44 abuts against the lower surface of board 2 (FIG. 10A).

In the board supporting process described above, the height of each height measurement portion is measured (height measurement process) by the respective upper ends of the plurality of height measuring instruments 44 attached to rising and falling body 41 (upper ends of contact portions 44*b*) being brought into contact with the plurality of height measurement portions of the lower surface of board 2. Then, warpage calculator 60*a* of control device 60 calculates the warpage of board 2 based on the heights of the plurality of height measurement portions of the lower surface of board 2 measured in the height measurement process.

Figure 10B:
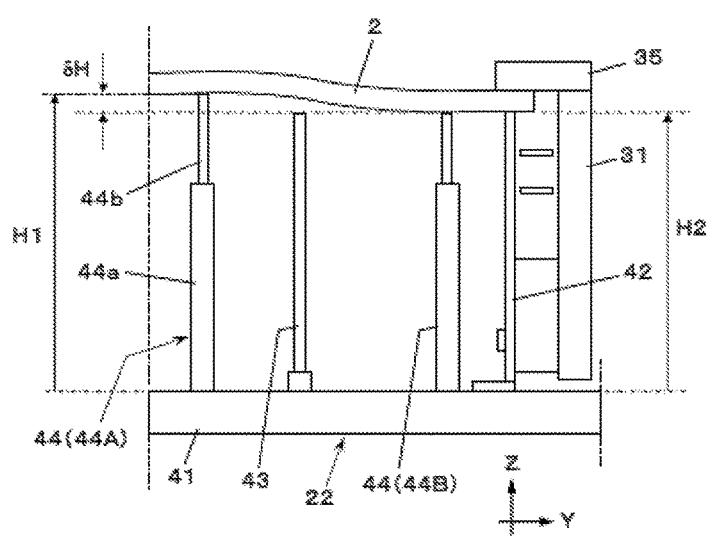

FIG. 10B is an enlarged view of region R illustrated in FIG. 10A. According to FIG. 10B, measurement height H of the height measurement portion near the middle section of board 2 in the width direction (Y direction), which has sign H1, exceeds measurement height H of the height measurement portion near the end portion of board 2 in the width direction, which has sign 112. In a case where H1 and H2 have a difference of δH in this case, the shape of board 2 is estimated and the warpage of the lower surface of board 2 is calculated based on the value of difference OH, the dimension of board 2 in the width direction (Y-axis direction), or the like. The measurement of the height of the lower surface of board 2 and the calculation of the warpage of board 2 are executed at the same time as the supporting of the lower surface of board 2 by board supporter 22.

After warpage calculator 60*a* calculates the warpage of board 2 with board supporter 22 supporting the lower surface of board 2 as described above, head moving mechanism 51 is operated and allows installation head 52 to reciprocate between a position above component supplier 13 and a position above board 2. Installation head 52 installs component 3 with respect to board 2 during this reciprocating movement (component installation process). Specifically, installation head 52 suctions component 3 supplied to component supply port 13K by each tape feeder 13*a* by using suction nozzle 52*a*, images component 3 with component capture 15, and then installs component 3 at a predetermined position on board 2 (component installation site). Control device 60 performs the image recognition based on the image of component 3 captured by component capture 15 and controls the operation of installation head 52 so that component 3 is installed on board 2 with a correct posture.

In the component installation process described above, control device 60 functions as a controller performing control of the height of the installation of component 3 by installation head 52 and with respect to board 2 and installing component 3 on board 2 based on the warpage of board 2 calculated by warpage calculator 60a (that is, based on the heights of the plurality of portions of the lower surface of board 2 measured by the plurality of height measuring instruments 44). Specifically, in a case where the height of the component installation site where component 3 is to be installed is higher by δZ due to the warpage of board 2, control device 60 sets the position that is higher by δZ than an installation height set in advance as the height at a time when component 3 is installed at the component installation site. As a result, a pressing force at a time when component 3 is pressed against board 2 can be prevented from becoming excessive and damage to component 3 or suction nozzle 52a is forestalled.

After component 3 is installed on board 2 as described above, board transport mechanism 12 lowers rising and falling body 41 and both ends of board 2 are lowered to the pair of transport belts 33. Then, the pair of transport belts 33 is operated, board 2 is transported, and board 2 is sent to the outside from component placement machine 1. As a result, the component placement work per sheet of board 2 by component placement machine 1 terminates.

As described above, the heights of the plurality of portions of the lower surface of board 2 that has the lower surface supported by board supporter 22 are measured by the plurality of height measuring instruments 44 attached to board supporter 22 and component 3 is installed on board 2 by the control of the height of the installation of component 3 by installation head 52 and with respect to board 2 being performed based on the obtained result (heights of the plurality of portions of the lower surface of board 2) in component placement machine 1 (by the component placement method) according to the present exemplary embodiment. In this configuration, the heights of the plurality of portions of the lower surface of board 2 can be collectively measured at the same time as the supporting of the lower surface of board 2, and thus the length of time required for the measurement of the height of board 2 can be reduced and takt time improvement can be achieved.

The exemplary embodiment according to the present disclosure has been described above, and the present disclosure is not limited to the exemplary embodiment described above. For example, the plurality of height measuring instruments 44 attached to board supporter 22 are contact measurement-type instruments measuring the height of the lower surface of board 2 by coming into contact with the lower surface of board 2 according to the exemplary embodiment described above, but the plurality of height measuring instruments 44 may also be, for example, non-contact measurement-type instruments irradiating the lower surface of board 2 with laser light and measuring the height of a destination of the laser light irradiation (laser-type height measuring instruments).

Although the height of the height measurement portion near the middle section of board 2 in the width direction and the height of the height measurement portion near the end portion of board 2 in the width direction are measured by height measuring instruments 44 and the warpage of board 2 is calculated by the difference between the two being obtained according to the exemplary embodiment described above, the warpage of board 2 may also be calculated by output of each height measuring instrument 44 being measured with regard to a board for correction that has a flatness ensured in advance and a difference from a value resulting from the measurement being obtained. In this case, the height of the height measurement portion near the end portion of board 2 in the width direction does not necessarily have to be measured.

A component placement machine and a component placement method for achieving takt time improvement by reducing the length of time required for board height measurement are provided.

What is claimed is:

1. A component placement machine installing a component by an installation head and with respect to a board arranged at a working position, the component placement machine comprising:
    a board supporter supporting a lower surface of the board arranged at the working position;
    a plurality of support pins attached to the board supporter, each of the plurality of support pins having a fixed height;
    a plurality of height measuring instruments attached to the board supporter, each of the plurality of height measuring instruments having a height exceeding the fixed height of the plurality of support pins, wherein the plurality of height measuring instruments are configured to measure heights of a plurality of portions of the lower surface of the board; and
    a controller configured to control an operation of the installation head by controlling an installation height of a component with respect to the board based on the measured heights of the plurality of portions of the lower surface of the board.

2. The component placement machine of claim 1, wherein the controller estimates a shape of the board based on the heights of the plurality of portions and controls a height of the installation head and with respect to the board based on the estimated shape of the board.

3. The component placement machine of claim 1, wherein at least one of the plurality of height measuring instruments measures the height of a middle position of the lower surface of the board in a width direction.

4. The component placement machine of claim 1, wherein each of the plurality of height measuring instruments measures a height of the lower surface of the board by coming into contact with the lower surface of the board.

5. The component placement machine of claim 1, wherein the board supporter is provided with a rising and falling body rising and falling below the board arranged at the working position and the plurality of support pins attached to a plurality of pin attachment sections disposed at the rising and falling body and supporting the lower surface of the board, and
    wherein each of the plurality of height measuring instruments has a shape allowing attachment to at least one of the plurality of pin attachment sections.

6. The component placement machine of claim 1, further comprising a plate member coupled to a conveyor unit, the plate member having a height equivalent to the plurality of support pins, wherein the plate member facilitates clamping of the board to the conveyor unit.

7. A component placement method for installing a component by an installation head and with respect to a board arranged at a working position, the component placement method comprising:
    a board supporting process of supporting a lower surface of the board arranged at the working position with a board supporter;

pushing up a warped part of the board by a plurality of fixed-height support pins in a case where the board has a warpage of downward curvature;

a height measurement process of measuring heights of a plurality of portions of the lower surface of the board with a plurality of height measuring instruments attached to the board supporter in a case where the board has a warpage of upward curvature; and a component installation process of installing the component on the board by performing control of a height of the installation of the component by the installation head and with respect to the board based on the heights of the plurality of portions.

8. The component placement method of claim 7, wherein a shape of the board is estimated based on the heights of the plurality of portions and the control of the height of the installation of the component by the installation head and with respect to the board is performed based on the shape of the board in the component installation process.

9. The component placement method of claim 7, further comprising: clamping the board to a conveyor unit via a plate member coupled to the conveyor, the plate member having a height equivalent to the plurality of support pins.

\* \* \* \* \*